United States Patent [19]

Petroff

[11] Patent Number: 5,001,532
[45] Date of Patent: Mar. 19, 1991

[54] IMPURITY BAND CONDUCTION DETECTOR HAVING PHOTOLUMINESCENT LAYER

[75] Inventor: Michael D. Petroff, Fullerton, Calif.

[73] Assignee: Rockwell International Corporation, El Segundo, Calif.

[21] Appl. No.: 403,629

[22] Filed: Sep. 6, 1989

[51] Int. Cl.⁵ ............................................. H01L 27/14
[52] U.S. Cl. ........................................ 357/30; 357/32; 357/16; 357/29; 357/61; 250/338.4; 250/349; 250/370.01
[58] Field of Search ...................... 357/32, 30 B, 30 H, 357/30 L, 30 Q, 30 D, 30 R, 61, 16, 58, 30 P, 29; 250/332, 338.1, 338.4, 339, 349, 370.01

[56] References Cited

U.S. PATENT DOCUMENTS

| | | | |
|---|---|---|---|
| 4,053,919 | 10/1977 | Andrews II et al. | 357/16 |
| 4,144,540 | 3/1979 | Bottka | 357/16 |
| 4,507,674 | 3/1985 | Gaalema | 357/32 |
| 4,568,960 | 2/1986 | Petroff et al. | 357/30 |
| 4,586,068 | 4/1986 | Petroff et al. | 357/30 L |
| 4,586,074 | 4/1986 | Stapelbroek et al. | 357/58 |
| 4,679,063 | 7/1987 | White | 357/30 B |
| 4,689,650 | 8/1987 | Dinan | 357/61 |
| 4,757,210 | 7/1988 | Bharat et al. | 250/578 |
| 4,829,355 | 5/1989 | Munier et al. | 357/58 |
| 4,860,074 | 8/1989 | Overhauser et al. | 357/58 |
| 4,896,202 | 1/1990 | Bharat et al. | 357/58 |
| 4,910,154 | 3/1990 | Zanio et al. | 357/30 B |

FOREIGN PATENT DOCUMENTS

| | | | |
|---|---|---|---|
| 0067958 | 4/1986 | Japan | 357/30 B |
| 0022474 | 1/1987 | Japan | 357/30 Q |
| 8800397 | 1/1988 | PCT Int'l Appl. | 357/30 Q |

Primary Examiner—Rolf Hille
Assistant Examiner—Minh Loan Tran
Attorney, Agent, or Firm—John C. McFarren

[57] ABSTRACT

An impurity band conduction (IBC) infrared detector is provided with a photoluminescent (PL) layer proximate the blocking layer of the device. The PL layer comprises a narrow band-gap semiconductor material selected for generating long wavelength infrared (LWIR) photoluminescent photons in response to incident photons of selected spectra. The PL layer improves the quantum efficiency of IBC devices in detecting incident photons in the short wavelength infrared (SWIR), ultraviolet (UV), and X-ray spectra. The thickness of the PL layer can be varied to optimize the photoluminescent response to incident photons of a selected spectrum. In a back-illuminated detector array, absorption of a SWIR photon in the PL layer results in one or more LWIR photons emitted in a time that is sufficiently shorter than the multiplexer frame time. The PL layer should be several times thicker than the absorption length of the SWIR photon, and the luminescent photons should not be reabsorbed by the PL layer or strongly reflected by the interface with the blocking layer.

18 Claims, 1 Drawing Sheet

IMPURITY BAND CONDUCTION DETECTOR HAVING PHOTOLUMINESCENT LAYER

TECHNICAL FIELD

The present invention relates to solid state infrared light detectors and, in particular, to an impurity band conduction detector having a photoluminescent layer for improved quantum efficiency in the short wavelength infrared spectrum.

BACKGROUND OF THE INVENTION

Impurity band conduction (IBC) infrared (IR) detectors such as blocked impurity band (BIB) detectors and solid state photomultipliers (SSPMs) are known in the art and described in U.S. Pat. No. 4,568,960 entitled "Blocked Impurity Band Detectors"; U.S. Pat. No. 4,586,068 entitled "Solid State Photomultiplier"; U.S. Pat. No. 4,586,074 entitled "Impurity Band Conduction Semiconductor Devices"; and U.S. Pat. No. 4,757,210 entitled "Edge Illuminated Detectors for Determination of Spectral Content". These prior patents provide background information for the present invention, and their teachings are incorporated herein by reference.

The current generation of IBC infrared detection devices has less than desired efficiency in detecting photons in the short wavelength infrared (SWIR) spectrum Although the quantum efficiency of IBC devices in the SWIR region can be improved greatly by edge illumination, this approach is difficult to implement in multiplexed arrays or large area discrete detectors. Thus, there is a need for an IBC device with improved quantum efficiency in the SWIR region that is suitable for front-illuminated detectors and for large area back-illuminated arrays having arbitrary pixel dimensions.

SUMMARY OF THE INVENTION

The present invention comprises an IBC detector for improved quantum efficiency in the short wavelength infrared (SWIR), ultraviolet (UV), and X-ray spectra. A typical IBC detector is modified by the present invention to include a thin layer of a direct narrow band-gap semiconductor material deposited proximate the blocking layer of the detector. The narrow band-gap semiconductor material is selected for the characteristic of producing long wavelength infrared (LWIR) photoluminescence from incident SWIR, UV, or X-ray photons.

In one embodiment, the present invention differs from the well known back-illuminated hybrid multiplexed detector array structure by the addition of a thin layer having the desired photoluminescent properties deposited on the oxide film over the transparent blocking layer contact. The main requirement of the photoluminescent (PL) layer of this embodiment is that the absorption of a SWIR photon result in the emission of one or more LWIR photons in a time that is sufficiently shorter than the multiplexer frame time. A second requirement is that the absorption length of the SWIR photon in the PL layer be several times smaller than the layer thickness. A third requirement is that the luminescent photon not be reabsorbed or strongly reflected at the interface between the PL layer and the blocking layer contact.

In other embodiments, such as front-illuminated detectors, the PL layer can be constructed to be effective in detecting UV and X-ray photons as well as SWIR. The thickness of the PL layer can be varied to optimize the LWIR photoluminescent response to incident photons in various spectral regions.

BRIEF DESCRIPTION OF THE DRAWINGS

For a more complete understanding of the present invention and for further advantages thereof, the following Description of the Preferred Embodiments makes reference to the accompanying Drawings, in which.

DESCRIPTION OF THE PREFERRED EMBODIMENTS

Figure 1:
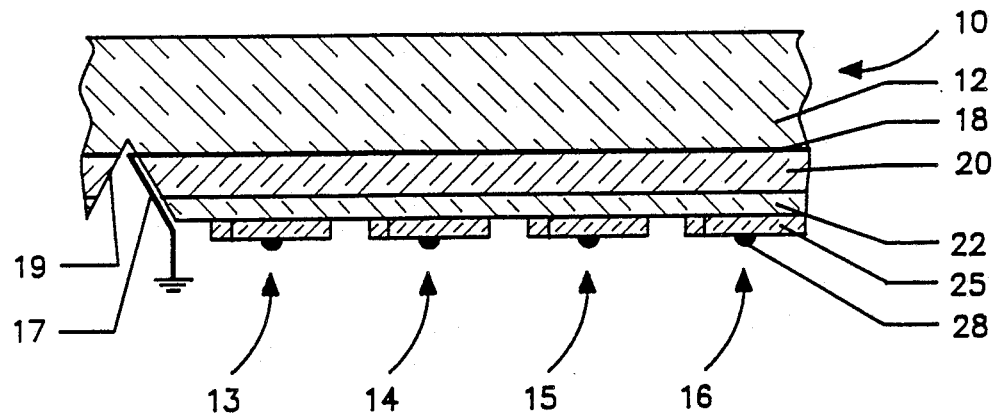
FIG. 1 is a cross sectional segment of a back-illuminated IBC detector array of the present invention.

Referring to FIG. 1, a segment of a back-illuminated multiplexed detector array 10 is shown in cross section. Array 10 is fabricated on a transparent substrate 12 and comprises a plurality of photon detecting pixels, such as pixels 13, 14, 15, and 16. Array 10 includes a buried electrical contact 18 between substrate 12 and an IR active layer 20. Contact 18 is connected to a lead 17 in a notch 19 etched into substrate 12 through the layers of array 10. Lead 17 and contact 18 provide a common electrical contact for the detector array. Each pixel of array 10 includes an indium bump, such as bump 28 on pixel 16, that provides an individual electrical contact for that particular pixel. The indium bumps provide electrical contact for the pixels when array 10 is mated with a multiplexer chip (not shown) as is well known in the art.

Figure 2:
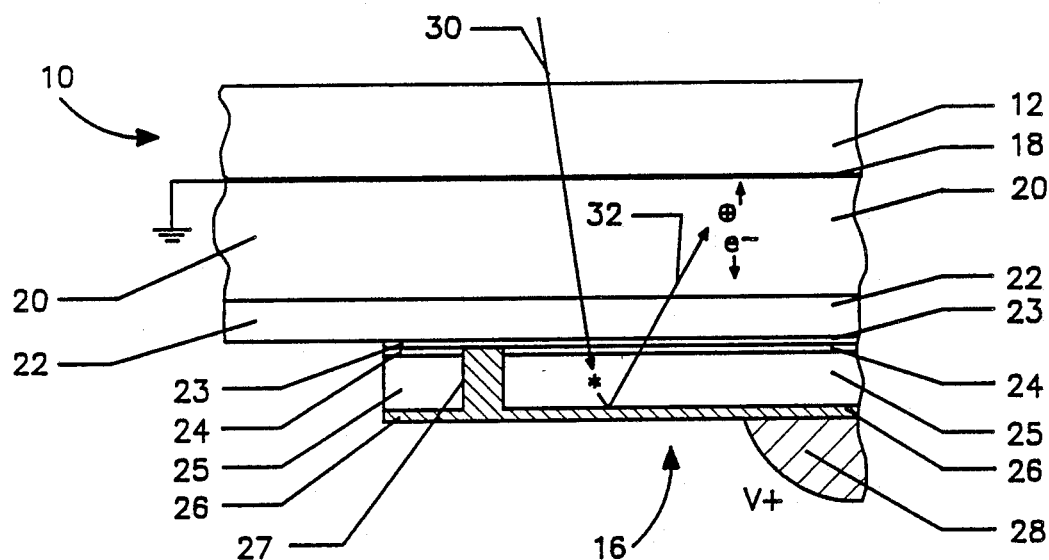
FIG. 2 is an enlarged cross sectional segment of the detector of FIG. 1 illustrating the layers of an individual pixel of the present invention.

Referring to FIG. 2, an expanded cross sectional view of array 10 shows the layers of pixel 16 in greater detail. As stated above, a common electrical contact 18 is disposed between substrate 12 and IR active layer 20. A blocking layer 22, approximately three microns thick, is disposed on active layer 20 as is well known in the art of IBC devices. Layers 12, 18, 20, and 22 are common to entire array 10. The additional layers to be described below pertain to each individual pixel of array 10.

A transparent contact 23 is disposed on blocking layer 22. Contact 23 is covered with a thin oxide layer 24 approximately 3000 angstroms thick. A layer of photoluminescent (PL) material 25 approximately five microns thick is disposed on oxide layer 24. PL layer 25 is covered with a metallic layer 26 to which indium bump 28 is welded. A notch 27 may be etched in PL layer 25 through oxide layer 24 so that metallic layer 26 can fill notch 27 and make electrical connection with transparent contact 23. Thus, contact 23, metallic layer 26, and indium bump 28 are all connected to form an electrical terminal for pixel 16. As is well known in the art, the indium bumps of array 10 form electrical contacts for the pixels when array 10 is mated with an integrated circuit chip (not shown) that functions as a multiplexer.

The function of PL layer 25 is to absorb incident SWIR photons 30 and generate photoluminescent LWIR photons 32 that are more readily detected by the IBC structure of array 10. A primary requirement of PL layer 25 is that the absorption of a SWIR photon 30 result in the emission of one or more LWIR photons 32 in a time that is sufficiently short compared with the frame time of the multiplexer connected to array 10.

The thickness of PL layer 25 should be several times greater than the absorption length of incident SWIR photons 30. In addition, the luminescent LWIR photons 32 should not be reabsorbed by PL layer 25 or reflected to any great extent by the interface of PL layer 25 with the oxide, contact, and blocking layers 24, 23, and 22. The luminescent LWIR photons 32 are reflected by metallic layer 26 back into IR active layer 20 where they generste impurity band hole-electron pairs.

The material of PL layer 25 may comprise variable band-gap semiconductors such as HgCdTe and PbSnTe, for example. The LWIR luminescence of these materials results from radiative recombination of hole-electron pairs generated by short wavelength primary photons, which is the dominant process for direct band-gap semiconductors at the operating temperatures of IBC devices. Also, the luminescent wavelength of these materials can be adjusted to coincide with the optimum quantum efficiency wavelength of the IBC device, generally about 15 to 20 microns. In addition, the refractive index of these materials is close to that of silicon so that the angle for total internal reflection is nearly 90°. This is important to prevent trapping and absorption of the LWIR luminescent photons 32 in PL layer 25.

Experiments with SSPMs have indicated that n-type long wavelength $Hg_{.8}Cd_{.2}Te$ is useful as a photoluminescent material having a radiative recombination time of about 2.5 microseconds at 7 degrees K. The index of refraction of this material is approximately 3.55, which is close to that of silicon at 3.37. This near match of refractive indexes permits about 60% of the LWIR luminescent photons to enter the IR active layer if reflection at the metallic layer is approximately 90%. The wavelength of luminescent photons from $Hg_{.8}Cd_{.2}Te$ at 7 degrees K is approximately 12 microns, which should yield a quantum efficiency of about 40% for one LWIR luminescent photon per SWIR photon absorbed in the PL layer. For incident photons having wavelengths from one to three microns, the absorption length in this material is about one micron. These performance estimates indicate that using this material in the PL layer of an SSPM, for example, may increase the quantum efficiency from its minimum of about 0.01 at 1.1 microns wavelength to approximately 0.4 if the luminescent photon yield is near unity. If the luminescent photon yield exceeds unity, then the quantum efficiency for SSPMs will be even greater than 0.4 using LWIR HgCdTe in the PL layer.

Figure 3:
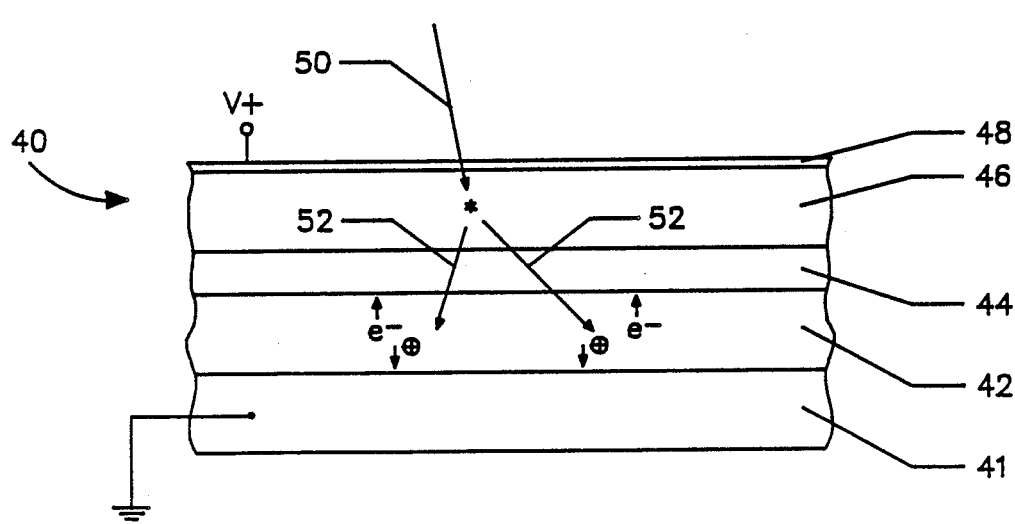
FIG. 3 is a cross section of a front-illuminated IBC detector of the present invention.

An embodiment of the present invention in a front-illuminated detector, such as an SSPM or a blocked impurity band (BIB) detector, is illustrated in FIG. 3. Detector 40 includes a substrate 41, an IR active layer 42, a blocking layer 44, a PL layer 46, and a metallic film or filter 48. Film 48 may comprise beryllium, for example, in a detector for X-rays. If PL layer 46 is made of the same n-type HgCdTe material described above, then layer 46 can seve as the top electrical contact because the charge carriers are not frozen out at IBC operating temperatures, the resistivity remaining below 100 ohm-cm. In detector 40, an incident photon 50 in the SWIR, UV, or X-ray spectrum is absorbed by PL layer 46 in a process that yields one or more luminescent LWIR photons 52. Photons 52 have a low probability of escaping detector 40 because of the small angle that produces total internal reflection at the top surface of PL layer 46. However, LWIR photons 52 easily enter the silicon layers of detector 40 and generate impurity band hole-electron pairs in active IR layer 42.

The addition of PL layer 46 to detector 40 can increase the quantum efficiency for detecting photons in the SWIR, UV and X-ray spectra. The thickness of PL layer 46 can be varied depending on the energy of the photons to be detected. For example, PL layer 46 may be as thin as 0.1 micron for detecting UV photons, but a thickness of more than 100 microns may be required for detecting 30 keV X-rays. Detector 40 can also provide energy resolution in the case of UV photons and X-rays. The number of luminescent LWIR photons produced by incident UV and X-ray photons is proportional to the incident photon energy, and this number of LWIR photons can be statistically large enough to obtain a significant energy resolution for the incident photons.

Although the present invention has been described with respect to specific embodiments thereof, various changes and modifications may be suggested to one skilled in the art. Therefore, it is intended that the present invention encompass such changes and modifications as fall within the scope of the appended claims.

I claim:

1. An impurity band conduction detector for detecting incident radiation, comprising:
   a blocking layer of semiconducting material having a low impurity concentration:
   an IR active layer of semiconducting material having a high impurity concentration, said IR active layer disposed proximate said blocking layer for detecting photons in a LWIR (long wavelength infrared) spectrum; and
   a photoluminescent layer of direct narrow band-gap semiconductor material disposed proximate said blocking layer for absorbing said incident radiation and generating luminescent LWIR photons.

2. The impurity band conduction detector of claim 1, wherein said photoluminescent layer comprises semiconductor material that absorbs incident photons in a SWIR (short wavelength infrared) spectrum to generate said luminescent LWIR photons.

3. The impurity band conduction detector of claim 1, wherein said photoluminescent layer comprises semiconductor material that absorbs incident photons in an ultraviolet spectrum to generate said luminescent LWIR photons.

4. The impurity band conduction detector of claim 1, wherein said photoluminescent layer comprises semiconductor material that absorbs incident photons in an X-ray spectrum to generate said luminescent LWIR photons.

5. The impurity band conduction detector of claim 1, wherein said photoluminescent layer comprises a HgCdTe material.

6. The impurity band conduction detector of claim 5, wherein said HgCdTe material comprises a $Hg_{.8}Cd_{.2}Te$ material.

7. The impurity band conduction detector of claim 1, wherein said photoluminescent layer comprises a PbSnTe material.

8. The impurity band conduction detector of claim 1, wherein said detector comprises a back-illuminated detector having a plurality of pixels, each of said pixels including a segment of said photoluminescent layer.

9. An impurity band conduction detector, comprising:
   an IR active layer of semiconducting material having a high impurity concentration disposed on a substrate;

a blocking layer of semiconducting material having a low impurity concentration disposed on said IR active layer; and a photoluminescent layer of direct narrow band-gap semiconductor material disposed above said blocking layer.

10. The impurity band conduction detector of claim 9, wherein said photoluminescent layer comprises semiconductor material that absorbs incident photons in a SWIR (short wavelength infrared) spectrum and generates luminescent LWIR (long wavelength infrared) photons.

11. The impurity band conduction detector of claim 9, wherein said photoluminescent layer comprises semiconductor material that absorbs incident photons in an ultraviolet spectrum and generates luminescent LWIR (long wavelength infrared) photons.

12. The impurity band conduction detector of claim 9, wherein said photoluminescent layer comprises semiconductor material that absorbs incident photons in an X-ray spectrum and generates luminescent LWIR (long wavelength infrared) photons.

13. The impurity band conduction detector of claim 9, wherein said photoluminescent layer comprises a HgCdTe material.

14. The impurity band conduction detector of claim 9, wherein said photoluminescent layer comprises a PbSnTe material.

15. The impurity band conduction detector of claim 9, wherein the impurity band conduction detector comprises a back-illuminated detector having a plurality of pixels, each of said pixels including a segment of said photoluminescent layer.

16. A method of detecting incident radiation, comprising the steps of:

providing a layered semiconductor device comprising an IR active layer of semiconducting material having a high impurity concentration, a blocking layer of semiconductor material having a low impurity concentration, and a photoluminescent layer of direct narrow band-gap semiconductor material;

receiving incident radiation on said layered semiconductor device;

absorbing said incident radiation in said photoluminescent layer of said layered semiconductor device;

generating luminescent LWIR (long wavelength infrared) photons as a result of absorbing said incident radiation; and detecting said LWIR photons generated in said layered semiconductor device.

17. The method of claim 16, wherein the step of detecting said LWIR photons comprises:

absorbing said LWIR photons in said IR active layer of the device;

generating impurity band hole-electron pairs in said IR active layer as a result of absorbing said LWIR photons; and measuring a current produced by said electrons to detect said incident radiation.

18. The method of claim 17, wherein the step of absorbing incident radiation comprises absorbing said incident radiation in a HgCdTe photoluminescent material.

* * * * *